US012593643B2

(12) United States Patent
Tannous et al.

(10) Patent No.:  US 12,593,643 B2
(45) Date of Patent:      Mar. 31, 2026

(54) BATCH THERMAL PROCESS CHAMBER

(71) Applicant: Applied Materials, Inc., Santa Clara, CA (US)

(72) Inventors: Adel George Tannous, Santa Clara, CA (US); Schubert S. Chu, San Francisco, CA (US); Shu-Kwan Lau, Sunnyvale, CA (US); Kartik Bhupendra Shah, Saratoga, CA (US); Zuoming Zhu, Sunnyvale, CA (US); Ala Moradian, Sunnyvale, CA (US); Surajit Kumar, San Jose, CA (US); Srinivasa Rangappa, Bangalore (IN); Chia Cheng Chin, Fremont, CA (US); Vishwas Kumar Pandey, Madhya Pradesh (IN)

(73) Assignee: Applied Materials, Inc., Santa Clara, CA (US)

( * ) Notice: Subject to any disclaimer, the term of this patent is extended or adjusted under 35 U.S.C. 154(b) by 552 days.

(21) Appl. No.: 17/919,911

(22) PCT Filed: Jul. 12, 2021

(86) PCT No.: PCT/US2021/041287
§ 371 (c)(1),
(2) Date: Oct. 19, 2022

(87) PCT Pub. No.: WO2022/031406
PCT Pub. Date: Feb. 10, 2022

(65) Prior Publication Data
US 2023/0230859 A1      Jul. 20, 2023

(30) Foreign Application Priority Data
Aug. 3, 2020   (IN) .............................. 202041033208

(51) Int. Cl.
| | |
|---|---|
| *H01L 21/67* | (2006.01) |
| *H01L 21/687* | (2006.01) |
| *H05B 3/00* | (2006.01) |

(52) U.S. Cl.
CPC .. *H01L 21/67115* (2013.01); *H01L 21/67184* (2013.01); *H01L 21/6719* (2013.01); *H01L 21/68771* (2013.01); *H05B 3/0047* (2013.01)

(58) Field of Classification Search
CPC ......... H01L 21/67115; H01L 21/67184; H01L 21/6719; H01L 21/68771; H05B 3/0047
See application file for complete search history.

(56) References Cited

U.S. PATENT DOCUMENTS

| | | |
|---|---|---|
| 5,011,794 A | 4/1991 | Grim et al. |
| 6,310,328 B1 | 10/2001 | Gat |

(Continued)

FOREIGN PATENT DOCUMENTS

| | | |
|---|---|---|
| CN | 106715753 A | 5/2017 |
| KR | 20010082334 A | 8/2001 |

(Continued)

OTHER PUBLICATIONS

Extended European Search Report for European Application No. 21853659.7 dated Jul. 1, 2024.

(Continued)

*Primary Examiner* — Robert G Bachner
(74) *Attorney, Agent, or Firm* — Patterson + Sheridan, LLP

(57) ABSTRACT

A batch processing chamber and a process kit for use therein are provided. The process kit includes an outer liner having an upper outer liner and a lower outer liner, an inner liner, and a top plate and a bottom plate attached to an inner surface of the inner liner. The top plate and the bottom plate form an enclosure together with the inner liner, and a (Continued)

cassette is disposed within the enclosure. The cassette including shelves configured to retain a plurality of substrates thereon. The inner liner has inlet openings disposed on an injection side of the inner liner and configured to be in fluid communication with a gas injection assembly of a processing chamber, and outlet openings disposed on an exhaust side of the inner liner and configured to be in fluid communication with a gas exhaust assembly of the processing chamber. The inner surfaces of the enclosure comprise material configured to cause black-body radiation within the enclosure.

20 Claims, 2 Drawing Sheets

(56) References Cited

U.S. PATENT DOCUMENTS

| | | | |
|---|---|---|---|
| 6,610,967 | B2 | 8/2003 | Gat |
| 6,727,474 | B2 | 4/2004 | Gat |
| 11,189,508 | B2 | 11/2021 | Hu et al. |
| 2001/0002668 | A1 | 6/2001 | Gat |
| 2002/0005400 | A1* | 1/2002 | Gat .................. H01L 21/67115 |
| | | | 219/390 |
| 2003/0049372 | A1* | 3/2003 | Cook ............... H01L 21/67069 |
| | | | 118/724 |
| 2007/0084406 | A1 | 4/2007 | Yudovsky et al. |
| 2008/0220150 | A1 | 9/2008 | Merry et al. |
| 2016/0362813 | A1 | 12/2016 | Bao et al. |
| 2019/0062904 | A1 | 2/2019 | Hawrylchak et al. |
| 2020/0040451 | A1 | 2/2020 | Applied Materials, Inc. |
| 2020/0105554 | A1 | 4/2020 | Hu et al. |

FOREIGN PATENT DOCUMENTS

| | | | |
|---|---|---|---|
| TW | 201704523 | A | 2/2017 |
| TW | 202024403 | A | 7/2020 |
| WO | 0034986 | A1 | 6/2000 |
| WO | 2007-026762 | A1 | 3/2007 |
| WO | 2016036868 | A1 | 3/2016 |
| WO | 2016200568 | A1 | 12/2016 |
| WO | 2020072241 | A1 | 4/2020 |

OTHER PUBLICATIONS

International Search Report and Written Opinion for International Application No. PCT/US2021/041287 dated Nov. 2, 2021.
Office Action for Chinese Application No. 2021800328851 dated Apr. 2, 2025.
Search Report for Chinese Application No. 2021800328851 dated Mar. 31, 2025.
Office Action for Korean Application No. 10-2022-7036667 dated Jul. 15, 24.
Office Action for Taiwan Application No. 110126011 dated Dec. 4, 24.
Search Report for Taiwan Application No. 110126011 dated Dec. 3, 24.

* cited by examiner

BATCH THERMAL PROCESS CHAMBER

BACKGROUND

Field

Examples described herein generally relate to the field of semiconductor processing, and more specifically, to pre-epitaxial baking of wafers.

Description of the Related Art

In conventional semiconductor fabrication, wafers are pre-cleaned to remove contaminants, such as oxides, prior to thin film growth thereon by epitaxial processes. Pre-cleaning of wafers is performed by baking the wafers in hydrogen and/or nitrogen atmosphere either in an epitaxial (Epi) chamber or in a furnace. Epi chambers have been designed to provide uniform temperature distribution over a wafer disposed within a processing volume and precise control of gas flow over the wafer. However, an Epi chamber processes one wafer at a time and thus may not provide required throughputs in fabrication processes. Furnaces enable batch processing of multiple wafers. However, furnaces do not provide uniform temperature distribution over each wafer and/or between wafers disposed in a processing volume and thus may not provide required qualities in fabricated devices.

Therefore, there is need for a process and processing equipment that is able to perform batch multi-wafer process while maintaining temperature distribution and gas flow over a wafer and between wafers.

SUMMARY

Embodiments of the disclosure include a process kit for use in a processing chamber. The process kit includes an outer liner having an upper outer liner and a lower outer liner, an inner liner, a top plate and a bottom plate attached to an inner surface of the inner liner. The top plate and the bottom plate form an enclosure together with the inner liner, and a cassette is disposed within the enclosure. The cassette includes a plurality of shelves configured to retain a plurality of substrates thereon. The inner liner has a plurality of first inlet openings disposed on an injection side of the inner liner and configured to be in fluid communication with a gas injection assembly of a processing chamber, and a plurality of first outlet openings disposed on an exhaust side of the inner liner and configured to be in fluid communication with a gas exhaust assembly of the processing chamber. The inner surfaces of the enclosure comprise material configured to cause black-body radiation within the enclosure.

Embodiments of the disclosure also include a processing chamber. The processing chamber includes a housing structure having a first side wall and a second side wall opposite the first side wall in a first direction, a gas injection assembly coupled to the first side wall, a gas exhaust assembly coupled to the second side wall, a quartz chamber disposed within the housing structure, and a process kit disposed within the quartz chamber. The process kit includes a cassette having a plurality of shelves configured to retain substrates thereon. The processing chamber further includes a plurality of upper lamp modules disposed on a first side of the quartz chamber and configured to provide radiative heat to the substrates, a plurality of lower lamp modules disposed on a second side of the quartz chamber opposite the first side in a second direction perpendicular to the first direction and configured to provide radiative heat to the substrates, and a lift-rotation mechanism configured to move the cassette in the second direction and rotate the cassette about the second direction. The process kit further includes an outer liner having an upper outer liner and a lower outer liner, an inner liner, and a top plate and a bottom plate attached to an inner surface of the inner liner. The top plate and the bottom plate form an enclosure together with the inner liner, and the cassette is disposed within the enclosure. The inner surfaces of the enclosure comprise material configured to cause black-body radiation within the enclosure. The inner liner includes a plurality of first inlet openings disposed on an injection side of the inner liner and configured to be in fluid communication with the gas injection assembly, and a plurality of first outlet openings disposed on an exhaust side of the inner liner and configured to be in fluid communication with the gas exhaust assembly.

Embodiments of the disclosure further include a processing system that includes a processing chamber and a transfer robot configured to transfer substrates into and from a process kit disposed in the processing chamber. The processing chamber includes a housing structure having a first side wall and a second side wall opposite the first side wall in a first direction, a gas injection assembly coupled to the first side wall, a gas exhaust assembly coupled to the second side wall, a quartz chamber disposed within the housing structure, and a process kit disposed within the quartz chamber. The process kit includes a cassette having a plurality of shelves configured to retain substrates thereon. The processing chamber further includes a plurality of upper lamp modules disposed on a first side of the quartz chamber and configured to provide radiative heat to the substrates, a plurality of lower lamp modules disposed on a second side of the quartz chamber opposite the first side in a second direction perpendicular to the first direction and configured to provide radiative heat to the substrates, and a lift-rotation mechanism configured to move the cassette in the second direction and rotate the cassette about the second direction. The process kit further includes an outer liner having an upper outer liner and a lower outer liner, an inner liner, and a top plate and a bottom plate attached to an inner surface of the inner liner. The top plate and the bottom plate form an enclosure together with the inner liner, and the cassette is disposed within the enclosure. The inner surfaces of the enclosure comprise material configured to cause black-body radiation within the enclosure. The inner liner includes a plurality of first inlet openings disposed on an injection side of the inner liner and configured to be in fluid communication with the gas injection assembly, and a plurality of first outlet openings disposed on an exhaust side of the inner liner and configured to be in fluid communication with the gas exhaust assembly.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

To facilitate understanding, identical reference numerals have been used, wherever possible, to designate identical elements that are common to the figures.

DETAILED DESCRIPTION

Generally, examples described herein relate to the field of semiconductor processing, and more specifically, to pre-epitaxial baking of wafers.

Some examples described herein provide a multi-wafer batch processing system where multiple substrates are pre-cleaned to remove contaminants, such as oxides, prior to thin film growth thereon by epitaxial processes by baking the substrates in hydrogen or nitrogen atmosphere in an epitaxial (Epi) chamber while uniform temperature distribution and controlled gas flow are maintained over a substrate and between substrates disposed within a processing volume. Thus, the multi-wafer batch processing system may provide improved qualities and throughputs in fabricated devices.

Various different examples are described below. Although multiple features of different examples may be described together in a process flow or system, the multiple features can each be implemented separately or individually and/or in a different process flow or different system.

Figure 1:
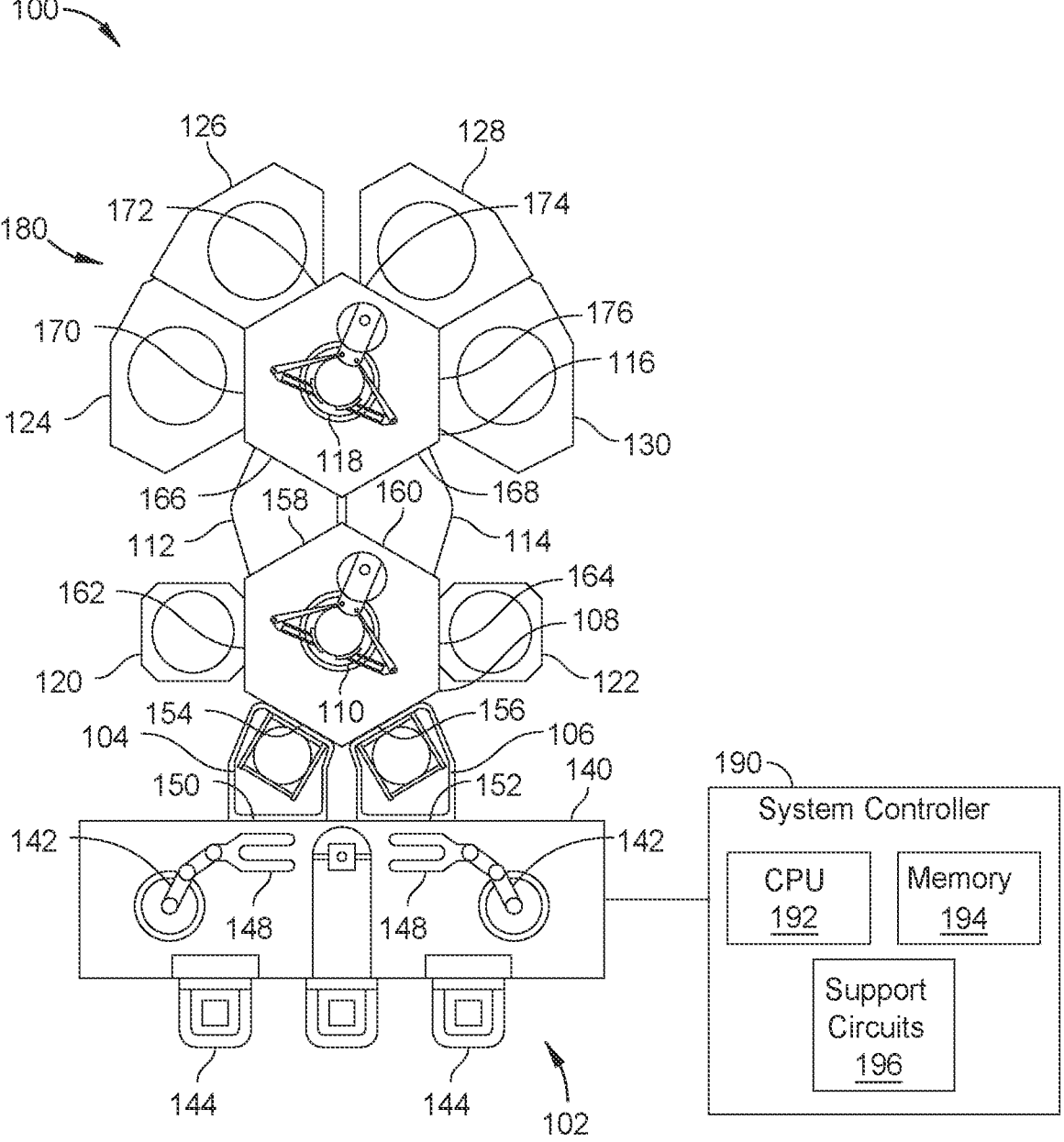
FIG. 1 is a schematic top-view diagram of an example of a batch multi-chamber processing system according to one or more embodiments.

FIG. 1 is a schematic top-view diagram of an example of a batch multi-chamber processing system 100 according to one or more embodiments. The processing system 100 generally includes a factory interface 102, load lock chambers 104, 106, transfer chambers 108, 116 with respective transfer robots 110, 118, holding chambers 112, 114, and processing chambers 120, 122, 124, 126, 128, 130. As detailed herein, substrates in the processing system 100 can be processed in and transferred between the various chambers without being exposed to an ambient environment exterior to the processing system 100. For example, substrates can be processed in and transferred between the various chambers in a low pressure (e.g., less than or equal to about 300 Torr) or vacuum environment without breaking the low pressure or vacuum environment between various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 to facilitate transfer of substrates. The docking station 140 is configured to accept one or more front opening unified pods (FOUPs) 144. In some examples, each factory interface robot 142 generally comprises a blade 148 disposed on one end of the respective factory interface robot 142 configured to transfer substrates from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 112, 114 and respective ports 162, 164 coupled to processing chambers 120, 122. Similarly, the transfer chamber 116 has respective ports 166, 168 coupled to the holding chambers 112, 114 and respective ports 170, 172, 174, 176 coupled to processing chambers 124, 126, 128, 130. The ports 154, 156, 158, 160, 162, 164, 166, 168, 170, 172, 174, 176 can be, for example, slit openings with slit valves for passing substrates therethrough by the transfer robots 110, 118 and for providing a seal between respective chambers to prevent a gas from passing between the respective chambers. Generally, any port is open for transferring a substrate therethrough; otherwise, the port is closed.

The load lock chambers 104, 106, transfer chambers 108, 116, holding chambers 112, 114, and processing chambers 120, 122, 124, 126, 128, 130 may be fluidly coupled to a gas and pressure control system (not shown). The gas and pressure control system can include one or more gas pumps (e.g., turbo pumps, cryo-pumps, roughing pumps, etc.), gas sources, various valves, and conduits fluidly coupled to the various chambers. In operation, a factory interface robot 142 transfers a substrate from a FOUP 144 through a port 150 or 152 to a load lock chamber 104 or 106. The gas and pressure control system then pumps down the load lock chamber 104 or 106. The gas and pressure control system further maintains the transfer chambers 108, 116 and holding chambers 112, 114 with an interior low pressure or vacuum environment (which may include an inert gas). Hence, the pumping down of the load lock chamber 104 or 106 facilitates passing the substrate between e.g., the atmospheric environment of the factory interface 102 and the low pressure or vacuum environment of the transfer chamber 108.

With the substrate in the load lock chamber 104 or 106 that has been pumped down, the transfer robot 110 transfers the substrate from the load lock chamber 104 or 106 into the transfer chamber 108 through the port 154 or 156. The transfer robot 110 is then capable of transferring the substrate to and/or between any of the processing chambers 120, 122 through the respective ports 162, 164 for processing and the holding chambers 112, 114 through the respective ports 158, 160 for holding to await further transfer. Similarly, the transfer robot 118 is capable of accessing the substrate in the holding chamber 112 or 114 through the port 166 or 168 and is capable of transferring the substrate to and/or between any of the processing chambers 124, 126, 128, 130 through the respective ports 170, 172, 174, 176 for processing and the holding chambers 112, 114 through the respective ports 166, 168 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 122 can be capable of performing a cleaning process; the processing chamber 120 can be capable of performing an etch process; and the processing chambers 124, 126, 128, 130 can be capable of performing respective epitaxial growth processes. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif.

A system controller 190 is coupled to the processing system 100 for controlling the processing system 100 or components thereof. For example, the system controller 190 may control the operation of the processing system 100 using a direct control of the chambers 104, 106, 108, 112, 114, 116, 120, 122, 124, 126, 128, 130 of the processing system 100 or by controlling controllers associated with the chambers 104, 106, 108, 112, 114, 116, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general-purpose processor that can be used in an industrial setting. The memory 194, or non-transitory computer-readable medium, is accessible by the CPU 192 and may be one or more of memory such as Random Access Memory (RAM), Read Only Memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular processing chamber) as, e.g., a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 116 and the holding chambers 112, 114. In other examples, more or fewer transfer chambers (e.g., one transfer chamber) and/or more or fewer holding chambers (e.g., no holding chambers) may be implemented as a transfer apparatus in a processing system.

Figure 2:
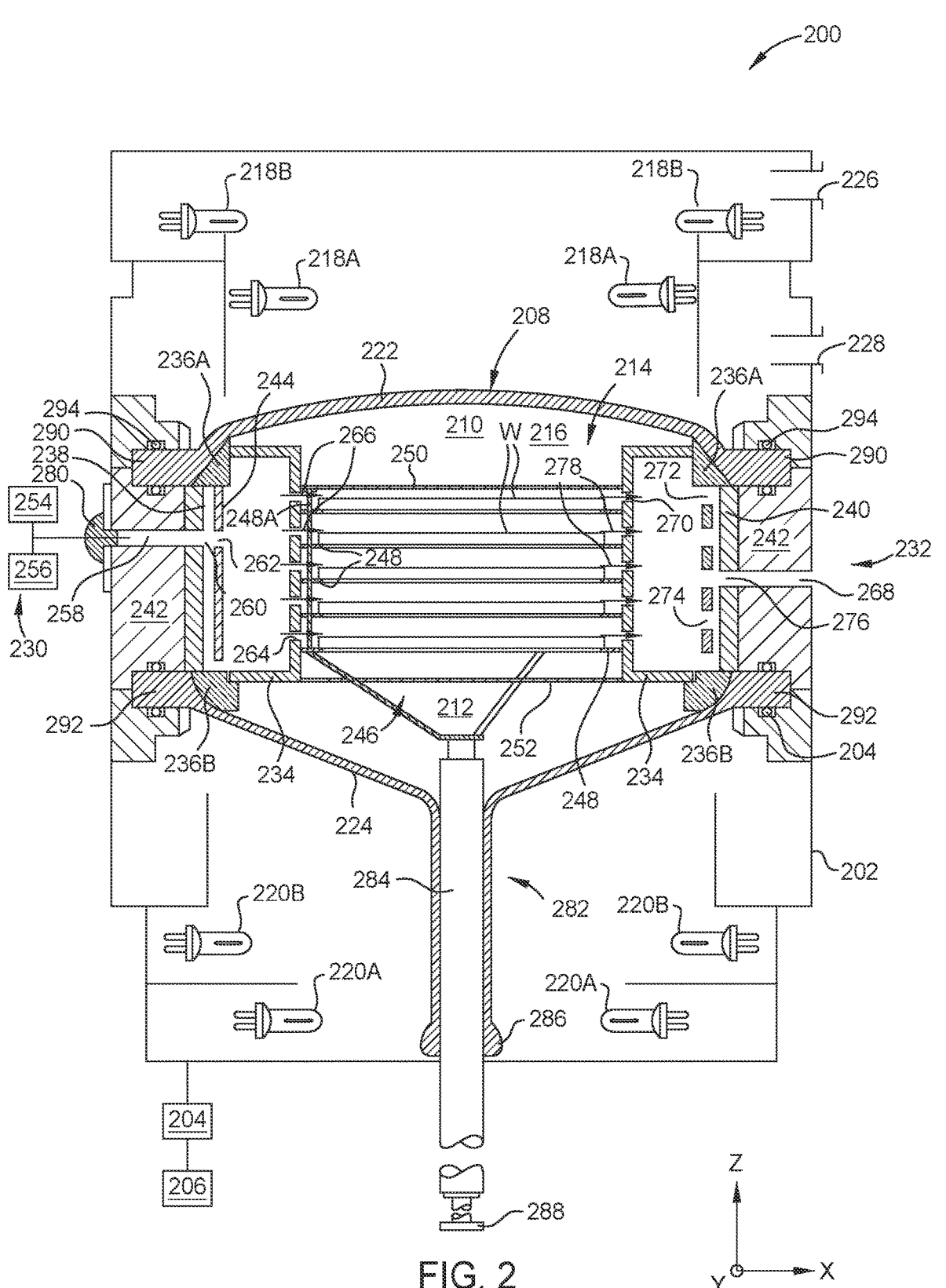
FIG. 2 is a schematic cross-sectional view of an exemplary processing chamber that may be used to perform batch multi-wafer cleaning processes according to one or more embodiments.

FIG. 2 is a schematic cross-sectional view of an exemplary processing chamber 200 that may be used to perform batch multi-wafer cleaning processes, such as a baking process in hydrogen and/or nitrogen atmosphere at a temperature of about 800° C. The processing chamber 200 may be any one of processing chambers 120, 122, 124, 126, 128, 130 from FIG. 1. Non-limiting examples of the suitable processing chambers that may be modified according to embodiments disclosed herein may include the RP EPI reactor, which is commercially available from Applied Materials, Inc. of Santa Clara, Calif. The processing chambers 200 may be added to a CENTURA® integrated processing system available from Applied Materials, Inc., of Santa Clara, Calif. While the processing chamber 200 is described below to be utilized to practice various embodiments described herein, other semiconductor processing chambers from different manufacturers may also be modified and used to practice the embodiment described in this disclosure.

The processing chamber 200 includes a housing structure 202, a support system 204, and a controller 206. The housing structure 202 is made of a process resistant material, such as aluminum or stainless steel. The housing structure 202 encloses various function elements of the processing chamber 200, such as a quartz chamber 208, which includes an upper portion 210 and a lower portion 212. A process kit 214 is adapted to receive multiple substrates W within the quartz chamber 208, in which a processing volume 216 is contained.

As used herein, the term "substrate" refers to a layer of material that serves as a basis for subsequent processing operations and includes a surface to be disposed for forming thin films thereon. The substrate may be a silicon wafer, silicon oxide, strained silicon, silicon germanium, doped or undoped polysilicon, doped or undoped silicon wafers, patterned or non-patterned wafers silicon on insulator (SOI), carbon doped silicon oxides, silicon nitride, indium phosphide, germanium, gallium arsenide, gallium nitride, quartz, fused silica, glass, or sapphire. Moreover, the substrate is not limited to any particular size or shape. The substrate can be of any shape or size, such as a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate.

Heating of the substrates W may be provided by radiation sources, such as one or more upper lamp modules 218A, 218B above the quartz chamber 208 in the Z-direction and one or more lower lamp modules 220A, 220B below the quartz chamber 208 in the Z-direction. In one embodiment, the upper lamp modules 218A, 218B and the lower lamp modules 220A, 220B are infrared lamps. Radiation from the upper lamp modules 218A, 218B and the lower lamp modules 220A, 220B travels through an upper quartz window 222 in the upper portion 210, and through a lower quartz window 224 in the lower portion 212. In some embodiments, cooling gases for the upper portion 210 can enter through an inlet 226 and exit through an outlet 228.

One or more gases are provided to the processing volume 216 of the quartz chamber 208 by a gas injection assembly 230, and processing byproducts are removed from the processing volume 216 by a gas exhaust assembly 232, which is typically in communication with a vacuum source (not shown).

The process kit 214 further includes multiple cylindrical liners, an inner liner 234 and an outer liner 236 that shields the processing volume 216 from side walls 242 of the housing structure 202. The outer liner 236 is formed of an upper outer liner 236A and a lower outer liner 236B. On a side facing the gas injection assembly 230 in the –X direction (referred to as an "injection side" hereinafter), an inlet shield 238 is disposed between the upper outer liner 236A and the lower outer liner 236B. On a side facing the gas exhaust assembly 232 in the +X direction (referred to as an "exhaust side" hereinafter), an outlet shield 240 is disposed between the upper outer liner 236A and the lower outer liner 236B. In some embodiments, the process kit 214 includes a heat shield 244 between the inlet shield 238 and the inner liner 234 on the injection side.

The inner liner 234 acts as cylinder walls to the processing volume 216 that houses a cassette 246 having a plurality of shelves 248 to retain multiple substrates W for a batch multi-wafer process. In the example shown in FIG. 2, five shelves 248 are shown. However, the cassette 246 may accommodate any number of shelves 248 within. The shelves 248 are interleaved between the substrates W retained in the cassette 246 so that a gap exists between the shelves 248 and the substrates W to allow efficient mechanical transfer of the substrates W to and from the shelves 248. The process kit 214 further includes a top plate 250 and a bottom plate 252 that are attached to an inner surface of the inner liner 234 and enclose the cylindrical processing volume 216 within the process kit 214. The top plate 250 and the bottom plate 252 are disposed at a sufficient distance apart from the shelves 248 to allow gas flow over substrates W retained in the shelves 248. The distance between the top plate 250 and the shelf 248 adjacent to the top plate 250 may or may not be the same as the distance between the bottom plate 252 and the shelf 248 adjacent to the bottom plate 252.

The gases can be injected to the processing volume 216 from a first gas source 254, such as hydrogen ($H_2$), Nitrogen ($N_2$), or any carrier gas, along with or without a second gas source 256, of the gas injection assembly 230 through one or more inlet openings 264 formed in the inner liner 234. The inlet openings 264 in the inner liner 234 are in fluid communication with the first gas source 254 and the second gas source 256 via an injection plenum 258 formed in the side wall 242, one or more inlet openings 260 formed in the inlet shield 238, and one or more inlet openings 262 formed in the heat shield 244. The injected gases form gas flow along a laminar flow path 266. The inlet openings 260, 262, 264 may be configured to provide gas flows with varied parameters, such as velocity, density, or composition. The inlet openings 260, 262, 264 may have any cross-sectional shapes that allow passage of gases from the first gas source 254 and the second gas source 256, such as circular holes or elongated slots.

The gases along the flow path 266 are configured to flow across the processing volume 216 into an exhaust plenum 268 formed in the side wall 242 to be exhausted by the gas exhaust assembly 232 from the processing volume 216. The gas exhaust assembly 232 is in fluid communication with one or more outlet openings 270 formed in the inner liner 234 via one or more outlet openings 272 formed in the upper outer liner 236A or one or more outlet openings 274 formed in the lower outer liner 236B, outlet openings 276 formed in the outlet shield 240, and the exhaust plenum 268, culminating the gases in an exhaust flow path 278. The outlet openings 270, 272, 274 may have any cross-sectional shapes that allow passage of gases from the processing volume 216 to the gas exhaust assembly 232, such as circular holes or elongated slots. The exhaust plenum 268 is coupled to an exhaust or vacuum pump (not shown). At least the injection plenum 258 may be supported by an inject cap 280. In some embodiments, the processing chamber 200 is adapted to supply one or more liquids for processes, such as deposition and etch processes. Furthermore, although only two gas sources 254, 256 are shown in FIG. 2, the processing chamber 200 could be adapted to accommodate as many fluid connections as needed for the processes executed in the processing chamber 200.

The support system 204 includes components used to execute and monitor pre-determined processes in the processing chamber 200. A controller 206 is coupled to the support system 204 and is adapted to control the processing chamber 200 and support system 204.

The processing chamber 200 includes a lift-rotation mechanism 282 positioned in the lower portion 212 of the housing structure 202. The lift-rotation mechanism 282 includes a shaft 284 positioned within a shroud 286 to which lift pins 248A disposed through openings (not labeled) formed in the shelves 248 of the process kit 214 is coupled. The shaft 284 is movable vertically in the Z-direction to allow loading substrates W into and unloading substrates W from the shelves 248 through a slit opening (not shown) in the inner liner 234 and a slit opening (not shown) in the outer liner 236 by a transfer robot, such as the transfer robots 110, 118 shown in FIG. 1. The shaft 284 is also rotatable in order to facilitate the rotation of substrates W disposed within the process kit 214 in the X-Y plane during processing. Rotation of the shaft 284 is facilitated by an actuator 288 coupled to the shaft 284. The shroud 286 is generally fixed in position, and therefore, does not rotate during processing.

The quartz chamber 208 includes peripheral flanges 290, 292 that are attached to and vacuum sealed to the side walls 242 of the housing structure 202 using O-rings 294. The peripheral flanges 290, 292 may all be formed from an opaque quartz to protect O-rings 294 from being directly exposed to the heat radiation. The peripheral flange 290 may be formed of an optically transparent material such as quartz.

Referring to FIG. 2, the inlet openings 260 in the inlet shield 238 are coupled with the injection plenum 258 and distributed in the circumferential direction for a certain angular position of the inner liner 234 such that the gases injected from the gas sources 254, 256 thorough the injection plenum 258 are distributed uniformly in the X-Y plane (i.e., within a substrate) within the processing volume 216. The outlet openings 276 in the outlet shield 240 are distributed in the circumferential direction for a certain angular position of the inner liner 234 and the gases are exhausted through the exhaust plenum 268.

The inlet openings 262 of the heat shield 244, and the inlet openings 262 and the outlet openings 270 of the inner liner 234 are also distributed in the circumferential direction of the inner liner 234 to improve the uniformity of the gases in the X-Y plane within the processing volume 216. Furthermore, the inlet openings 262 and the outlet openings 270 of the inner liner 234 are distributed in the Z-direction and aligned with the shelves 248 such that the gases are distributed evenly among substrates W retained in the shelves 248 in the processing volume 216.

Referring to FIG. 2, the top plate 250 and the bottom plate 252 together with the inner liner 234 form an enclosure, containing the processing volume 216 therein, with small openings (i.e., the inlet openings 260 and the outlet openings 270) in the inner liner 234. Within the enclosure, radiative heat provided from the upper lamp modules 218A, 218B and the lower lamp modules 220A, 220B is distributed uniformly both in the Z direction (i.e., wafer to wafer within the cassette 246) in the X-Y plane (i.e., within a substrate disposed within the cassette 246). In general, within an enclosure with small openings, having inner surfaces that are opaque and are only partially reflective (i.e., having a surface emissivity close to 1), black-body radiation may be established, providing a steady state equilibrium radiation at a uniform temperature within the enclosure. The temperature uniformity within the enclosure varies with the surface emissivities of the inner surfaces of the enclosure and sizes of the openings formed in the enclosure. Thus, the top plate 250 and the bottom plate 252 are formed of graphite or silicon-carbide (SiC) coated graphite with a surface emissivity of about 0.7 to 0.8, quartz, or silicon (Si). In some embodiments, the top plate 250 and the bottom plate 252 are formed of ceramic material with a high surface emissivity, such as silicon carbide (SiC) with a surface emissivity of between about 0.83 and about 0.96, such that heat loss from the processing volume 216 through the top plate 250 and/or the bottom plate 252 is reduced. The inner liner 234 is also formed of graphite, silicon-carbide (SiC) coated graphite, silicon carbide (SiC), quartz, or silicon (Si). In some embodiments, an inner surface of the inner liner 234 is coated with gold (Au) to improve the temperature uniformity by further reducing heat loss from the processing volume 216 through the inner liner 234.

The inlet openings 264 and the outlet openings 270 in the inner liner 234 are formed small such that heat loss from the processing volume 216 through the inlet openings 264 and the outlet openings 270 and thus temperature variations on a substrate near the inlet openings 264 and the outlet openings 270 are minimized. The inner liner 234 further includes a slit opening (not shown) that is aligned with a slit opening (not shown) formed in the outer liner 236 between the upper outer liner 236A and the lower outer liner 236B on a front side facing the –Y direction, through which a substrate may be transferred into and from the processing volume 216 by a transfer robot, such as the transfer robots 110, 118 shown in FIG. 1. In some embodiments, substrates W are transferred into and from the cassette 246 one by one. The slit opening of the inner liner 234 is also made small to reduce heat loss from the processing volume 216 through the slit opening of the inner liner 234 and thus temperature variations on a substrate near the slit opening of the inner liner 234 are minimized. In some embodiments, the slit opening of the outer liner 236 is openable and closable by using a slit valve (not shown). The shelves 248 of the cassette 246 disposed within the processing volume 216 are also formed of ceramic material with a high surface emissivity, such as silicon carbide (SiC), graphite, silicon-carbide (SiC) coated graphite, quartz, or silicon (Si).

The inlet shield 238 disposed outside of the inner liner 234 on the injection side and the heat shield 244 disposed between the inlet shield 238 and the inner liner 234 further reduce heat loss from the processing volume 216 through the inlet openings 264 in the inner liner 234. The outlet shield 240 disposed outside of the inner liner 234 on the exhaust side also reduces heat loss from the processing volume 216 through the outlet openings 270 in the inner liner 234. In some embodiments, the process kit 214 includes heat shields (not shown) outside of the inner liner 234 in the proximity of the slit opening to reduce heat loss from the processing volume through the slit opening of the inner liner 234. The inlet shield 238, the outlet shield 240, and the heat shield 244 may be formed of material having a high reflectivity (i.e., low emissivity of between about 99.9% and 100%). Both of the upper outer liner 236A and the lower outer liner 236B are formed of material having lower conductivity and emissivity compared to graphite, such as opaque quartz, and further reduce heat loss from the processing volume 216 within the process kit 214.

In some embodiments, the temperature uniformity within the processing volume 216 may be controlled by a power ratio of the lower lamp modules 220A, 220B and the upper lamp modules 218A, 218B (referred to as a lower-upper power ratio), a power ratio of the inner upper lamp modules 218A and the outer upper lamp modules 218B (referred to as upper inner-outer power ratio), and a power ratio of the inner lower lamp modules 220A and the outer lower lamp modules 220B (referred to as lower inner-outer power ratio). Total power requirements vary with a number of factors, such as materials for substrates W retained in the cassette 246, target temperature requirements of the substrates W. In one example, a total power of the upper lamp modules 218A, 218B and the lower lamp modules 220A, 220B is about 45 KW, the lower-upper power ratio is 70%/30%, the upper inner-outer power ratio is 40%/60%, and the lower inner-outer power ratio is 30%/70% to achieve temperature uniformity within a substrate W and between substrates W retained within the processing volume 216. In another example, a total power of the upper lamp modules 218A, 218B and the lower lamp modules 220A, 220B is about 45 KW, the lower-upper power ratio is 42%/58%, and the lower inner-outer power ratio is 30%/70%. These power ratios can be easily adjusted to achieve required temperature uniformity between substrates W or within a substrate.

In examples described herein, a multi-wafer batch processing system is shown where multiple substrates are pre-cleaned to remove contaminants, such as oxides, prior to thin film growth thereon by epitaxial processes by baking the substrates in hydrogen or nitrogen atmosphere in an epitaxial (Epi) chamber while uniform temperature distribution and controlled gas flow are maintained over a substrate and between substrates disposed within a processing volume. Thus, the multi-wafer batch processing system may provide required qualities and throughputs in fabricated devices.

While the foregoing is directed to various examples of the present disclosure, other and further examples may be devised without departing from the basic scope thereof, and the scope thereof is determined by the claims that follow.

The invention claimed is:

1. A processing chamber, comprising:
   a housing structure having a first side wall and a second side wall opposite the first side wall in a first direction;
   a gas injection assembly coupled to the first side wall;
   a gas exhaust assembly coupled to the second side wall;
   a quartz chamber disposed within the housing structure;
   a process kit disposed within the quartz chamber, the process kit comprising:
   an enclosure having inner surfaces comprising a material configured to cause black-body radiation within the enclosure;
   a cassette disposed within the enclosure, the cassette having a plurality of shelves configured to retain substrates thereon;
   an outer liner comprising an upper outer liner and a lower outer liner;
   an inner liner having:
   a plurality of first inlet openings disposed on an injection side of the inner liner and configured to be in fluid communication with the gas injection assembly; and
   a plurality of first outlet openings disposed on an exhaust side of the inner liner and configured to be in fluid communication with the gas exhaust assembly; and
   a top plate and a bottom plate attached to an inner surface of the inner liner, the top plate and the bottom plate forming the enclosure together with the inner liner;
   a plurality of upper lamp modules disposed on a first side of the quartz chamber and configured to provide radiative heat to the substrates; and
   a plurality of lower lamp modules disposed on a second side of the quartz chamber opposite the first side in a second direction perpendicular to the first direction and configured to provide radiative heat to the substrates.

2. The processing chamber of claim 1, wherein the inner surface of the inner liner is coated with gold.

3. The processing chamber of claim 1, wherein the inner liner, the top plate, and the bottom plate comprise silicon carbide (SIC).

4. The processing chamber of claim 1, wherein the inner liner, the top plate, and the bottom plate comprise silicon-carbide (SiC) coated graphite.

5. The processing chamber of claim 1, wherein the process kit further comprises:
   an inlet shield disposed between the upper outer liner and the lower outer liner on the injection side, the inlet shield having a plurality of second inlet openings in fluid communication with the plurality of first inlet openings in the inner liner; and an outlet shield disposed between the upper outer liner and the lower outer liner on the exhaust side, the outlet shield having a plurality of second outlet openings in fluid communication with the plurality of first outlet openings in the inner liner.

6. The processing chamber of claim 5, further comprising:

a heat shield disposed between the inlet shield and the inner liner on the injection side, the heat shield having a plurality of third inlet openings in fluid communication with the plurality of first inlet openings in the inner liner.

7. The processing chamber of claim 1, wherein the plurality of shelves comprises silicon carbide (SiC).

8. The processing chamber of claim 1, wherein the plurality of shelves comprises silicon-carbide (SiC) coated graphite.

9. A processing chamber, comprising:

a housing structure having a first side wall and a second side wall opposite the first side wall in a first direction;

a gas injection assembly coupled to the first side wall;

a gas exhaust assembly coupled to the second side wall;

a quartz chamber disposed within the housing structure;

a process kit disposed within the quartz chamber, the process kit comprising:

a cassette having a plurality of shelves configured to retain substrates thereon;

an outer liner comprising an upper outer liner and a lower outer liner;

an inner liner having:

a plurality of first inlet openings disposed on an injection side of the inner liner and configured to be in fluid communication with the gas injection assembly; and a plurality of first outlet openings disposed on an exhaust side of the inner liner and configured to be in fluid communication with the gas exhaust assembly; and a top plate and a bottom plate attached to an inner surface of the inner liner, the top plate and the bottom plate forming an enclosure together with the inner liner, wherein inner surfaces of the enclosure comprise material configured to cause black-body radiation within the enclosure;

a plurality of upper lamp modules disposed on a first side of the quartz chamber and configured to provide radiative heat to the process kit;

a plurality of lower lamp modules disposed on a second side of the quartz chamber opposite the first side in a second direction perpendicular to the first direction and configured to provide radiative heat to the process kit; and a lift-rotation mechanism configured to move the cassette in the second direction and rotate the cassette about the second direction.

10. The processing chamber of claim 9, wherein the inner surface of the inner liner is coated with gold.

11. The processing chamber of claim 9, wherein the inner liner, the top plate, and the bottom plate comprise silicon carbide (SiC).

12. The processing chamber of claim 9, wherein the inner liner, the top plate, and the bottom plate comprise silicon-carbide (SiC) coated graphite.

13. The processing chamber of claim 9, wherein the process kit further comprises:

an inlet shield disposed between the upper outer liner and the lower outer liner on the injection side, the inlet shield having a plurality of second inlet openings in fluid communication with the plurality of first inlet openings in the inner liner; and an outlet shield disposed between the upper outer liner and the lower outer liner on the exhaust side, the outlet shield having a plurality of second outlet openings in fluid communication with the plurality of first outlet openings in the inner liner.

14. The processing chamber of claim 13, wherein the process kit further comprises:

a heat shield disposed between the inlet shield and the inner liner on the injection side, the heat shield having a plurality of third inlet openings in fluid communication with the plurality of first inlet openings in the inner liner.

15. The processing chamber of claim 9, wherein the plurality of shelves comprises silicon carbide (SiC).

16. The processing chamber of claim 9, wherein the plurality of shelves comprises silicon-carbide (SiC) coated graphite.

17. A processing system comprising:

a processing chamber comprising:

a housing structure having a first side wall and a second side wall opposite the first side wall in a first direction;

a gas injection assembly coupled to the first side wall;

a gas exhaust assembly coupled to the second side wall;

a quartz chamber disposed within the housing structure;

a process kit disposed within the quartz chamber, the process kit comprising:

an enclosure having inner surfaces comprising a material configured to cause black-body radiation within the enclosure;

a cassette disposed within the enclosure, the cassette having a plurality of shelves configured to retain substrates thereon;

an outer liner comprising an upper outer liner and a lower outer liner;

an inner liner having:

a plurality of first inlet openings disposed on an injection side of the inner liner and configured to be in fluid communication with the gas injection assembly;

a plurality of first outlet openings disposed on an exhaust side of the inner liner and configured to be in fluid communication with the gas exhaust assembly;

a slit opening; and a top plate and a bottom plate attached to an inner surface of the inner liner, the top plate and the bottom plate forming the enclosure together with the inner liner, wherein inner surfaces of the enclosure comprise material configured to cause black-body radiation within the enclosure;

a plurality of upper lamp modules disposed on a first side of the quartz chamber and configured to provide radiative heat to the substrates;

a plurality of lower lamp modules disposed on a second side of the quartz chamber opposite the first side in a second direction perpendicular to the first direction and configured to provide radiative heat to the substrates; and a lift-rotation mechanism configured to move the cassette in the second direction and rotate the cassette about the second direction; and a transfer robot configured to transfer substrates into and from the process kit disposed in the processing chamber.

18. The processing system of claim 17, wherein the inner surface of the inner liner is coated with gold.

19. The processing system of claim 17, wherein the inner liner, the top plate, the bottom plate, and the plurality of shelves comprise material selecting from silicon carbide (SiC) and silicon-carbide (SiC) coated graphite.

20. The processing system of claim 17, wherein the process kit further comprises:

an inlet shield disposed between the upper outer liner and the lower outer liner on the injection side, the inlet shield having a plurality of second inlet openings in fluid communication with the plurality of first inlet openings in the inner liner;

an outlet shield disposed between the upper outer liner and the lower outer liner on the exhaust side, the outlet shield having a plurality of second outlet openings in fluid communication with the plurality of first outlet openings in the inner liner; and a heat shield disposed between the inlet shield and the inner liner on the injection side, the heat shield having a plurality of third inlet openings in fluid communication with the plurality of first inlet openings in the inner liner.

* * * * *